(12) United States Patent
Bae

(10) Patent No.: US 9,780,244 B2
(45) Date of Patent: Oct. 3, 2017

(54) SOLAR CELL MODULE

(71) Applicant: LG INNOTEK CO., LTD., Seoul (KR)

(72) Inventor: Do Won Bae, Seoul (KR)

( * ) Notice: Subject to any disclaimer, the term of this patent is extended or adjusted under 35 U.S.C. 154(b) by 0 days.

(21) Appl. No.: 14/390,785

(22) PCT Filed: Apr. 5, 2013

(86) PCT No.: PCT/KR2013/002880
§ 371 (c)(1),
(2) Date: Oct. 5, 2014

(87) PCT Pub. No.: WO2013/151388
PCT Pub. Date: Oct. 10, 2013

(65) Prior Publication Data
US 2015/0171246 A1   Jun. 18, 2015

(30) Foreign Application Priority Data

Apr. 5, 2012 (KR) ........................ 10-2012-0035663

(51) Int. Cl.
| | | |
|---|---|---|
| H01L 31/042 | (2014.01) | |
| H01L 31/049 | (2014.01) | |
| H01G 9/20 | (2006.01) | |
| H01L 31/02 | (2006.01) | |

(52) U.S. Cl.
CPC ......... *H01L 31/049* (2014.12); *H01G 9/2059* (2013.01); *H01L 31/0201* (2013.01); *Y02E 10/50* (2013.01)

(58) Field of Classification Search
CPC ............... H01L 31/048–31/0488; H02S 30/10

USPC .................................................. 136/243–265
See application file for complete search history.

(56) References Cited

U.S. PATENT DOCUMENTS

| | | | | |
|---|---|---|---|---|
| 4,556,788 | A * | 12/1985 | Hanak ........................ | 250/203.4 |
| 4,571,446 | A * | 2/1986 | Yamazaki ............. | H01L 31/048 |
| | | | | 136/244 |
| 5,180,442 | A * | 1/1993 | Elias ............................. | 136/251 |
| 5,994,641 | A * | 11/1999 | Kardauskas .......... | H01L 31/048 |
| | | | | 136/246 |
| 6,215,060 | B1 * | 4/2001 | Komori .................. | B32B 27/08 |
| | | | | 136/251 |
| 2004/0182432 | A1 * | 9/2004 | Yoda et al. .................... | 136/244 |

(Continued)

FOREIGN PATENT DOCUMENTS

| | | |
|---|---|---|
| JP | 2001-177125 A | 6/2001 |
| JP | 2009-246022 A | 10/2009 |
| JP | 2011-253836 A | 12/2011 |

OTHER PUBLICATIONS

Search Report for International Application No. PCT/KR2013/002880.

*Primary Examiner* — Bach Dinh
*Assistant Examiner* — Niki Bakhtiari
(74) *Attorney, Agent, or Firm* — LRK Patent Law Firm

(57) ABSTRACT

A solar cell module includes a solar cell panel comprising a lower substrate and a plurality of solar cells on the lower substrate; a protective substrate on the solar cell panel; and a buffer part between the solar cell panel and the protective substrate, wherein the lower substrate includes a first lower substrate supporting the solar cell and a second lower substrate disposed along a lateral side of the buffer part.

8 Claims, 3 Drawing Sheets

(56) References Cited

U.S. PATENT DOCUMENTS

2010/0307559 A1* 12/2010 Yamazaki ............. H01L 31/048
  136/244
2013/0269766 A1* 10/2013 Park ................... H01L 51/4213
  136/256

* cited by examiner

[Figure 1]
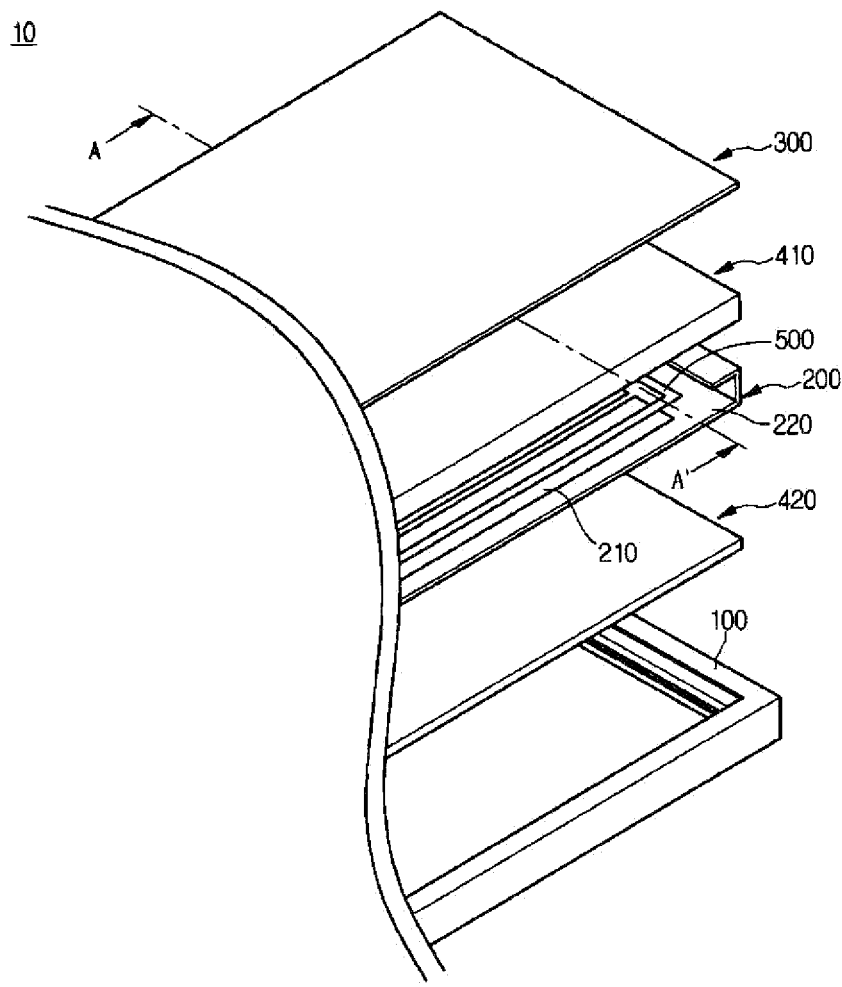
[Figure 2]
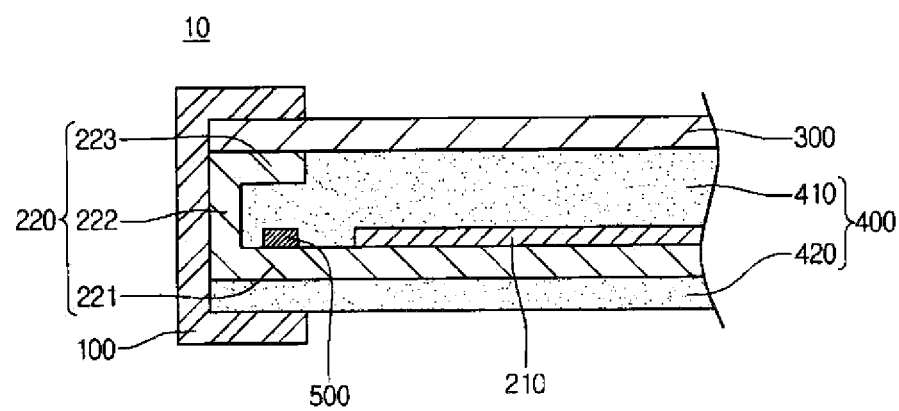

[Figure 3]
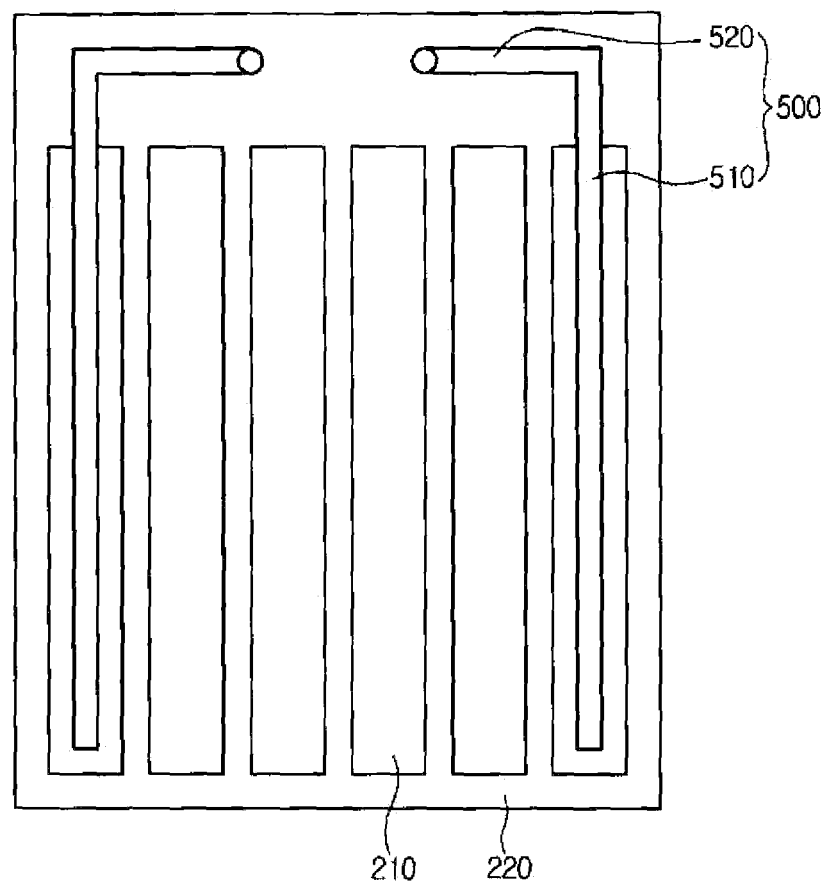
[Figure 4]
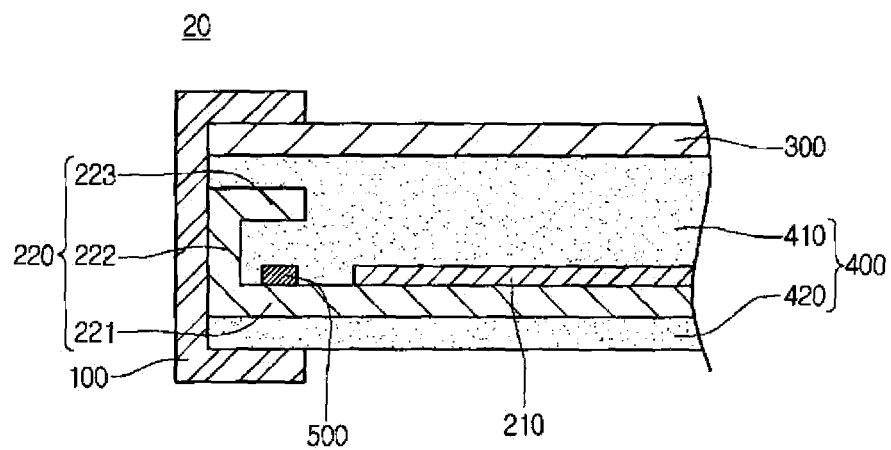

[Figure 5]
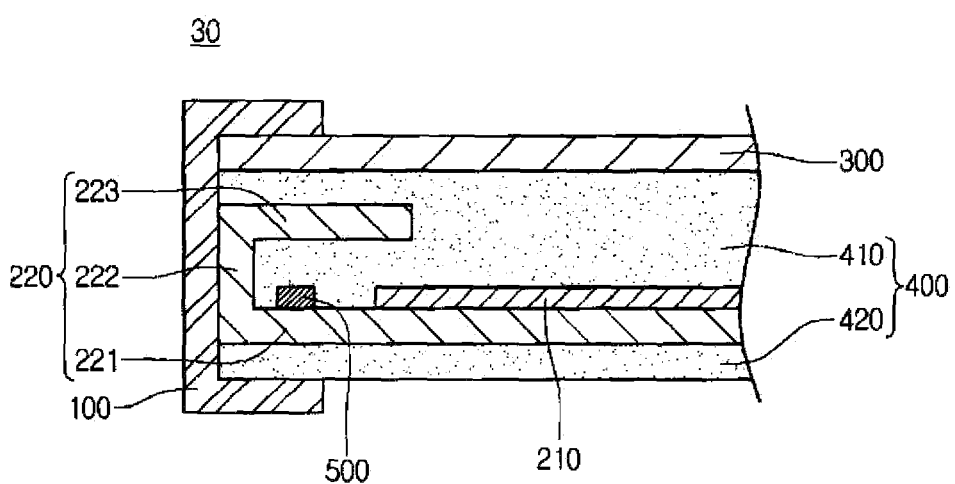

SOLAR CELL MODULE

TECHNICAL FIELD

The embodiment relates to a solar cell module.

BACKGROUND ART

A solar cell module to convert light energy into electrical energy through photoelectric conversion effect has been extensively used as a device to obtain non-pollution energy contributing to the conservation of global environment.

As the photoelectric conversion effect of a solar cell is improved, a great number of solar cell systems having a solar cell module are installed even for home use.

In order to output power generated from the solar cell module including solar cells that generate power from the light of the sun to the outside, conductors acting as positive and negative electrodes are provided in the solar cell module, and terminals of the conductors, which serve as connectors connected to a cable of outputting current to the outside, are withdrawn out of a photovoltaic module.

However, in a case of a solar cell module having a typical structure, reliability of the solar cell module is frequently degraded due to penetration of moisture into a periphery of the solar cell module.

DISCLOSURE OF INVENTION

Technical Problem

The embodiment provides a solar cell module having improved reliability.

Solution to Problem

According to the embodiment, there is provided solar cell module including: a solar cell panel comprising a lower substrate and a plurality of solar cells on the lower substrate; a protective substrate on the solar cell panel; and a buffer part between the solar cell panel and the protective substrate, wherein the lower substrate includes a first lower substrate supporting the solar cell and a second lower substrate disposed along a lateral side of the buffer part.

Advantageous Effects of Invention

The solar cell module according to the embodiment includes a lower substrate supporting a solar cell, and the lower substrate may surround a lateral side of the buffer part. An outer peripheral portion of the lower substrate may be folded inward of the solar cell module. Accordingly, the route of moisture penetration through the lower substrate becomes long so that moisture penetration into the solar cell module may be minimized. Therefore, the reliability of the solar cell module can be improved.

In addition, if the lower substrate has a color, the lower substrate may shield the bus bar on the solar cell panel. Accordingly, a separate work for shielding the bus bar may be omitted so that a process may be simplified.

BRIEF DESCRIPTION OF DRAWINGS

FIG. 1 is an exploded perspective view showing a solar cell module according to the embodiment.

FIG. 2 is a sectional view taken along line A-A' of FIG. 1.

FIG. 3 is a front view showing a solar cell panel included in a solar cell module according to a first embodiment.

FIG. 4 is a sectional view showing a solar cell module according to a second embodiment.

FIG. 5 is a sectional view showing a solar cell module according to a third embodiment.

MODE FOR THE INVENTION

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

The thickness and size of each layer (or film), each region, each pattern, or each structure shown in the drawings may be exaggerated, omitted or schematically drawn for the convenience or clarity of explanation. In addition, the size of the layer (or film), the region, the pattern, or the structure does not utterly reflect an actual size.

Hereinafter, the embodiment will be described with reference to accompanying drawings in detail.

First, a solar cell module according to the first embodiment will be described in detail with reference to FIGS. 1 to 3. FIG. 1 is an exploded perspective view showing a solar cell module according to the embodiment. FIG. 2 is a sectional view taken along line A-A' of FIG. 1. FIG. 3 is a front view showing a solar cell panel included in a solar cell module according to the first embodiment.

Referring to FIGS. 1 to 3, the solar cell module 10 according to the first embodiment includes a frame 100, a solar cell panel 200, a protective substrate 300, and a buffer part 400.

The frame 100 is provided outside the solar cell panel 200. The frame 100 receives the solar cell panel 200, the protective substrate 300, and the buffer part 400. In more detail, the frame 100 surrounds the lateral side of the solar cell panel 200.

For example, the frame 100 may be a metal frame 100. In addition, the frame 100 may include aluminum (Al), stainless steel, iron, or resin.

The solar cell panel 200 is disposed inside the frame 100. The solar cell panel 200 has a plate shape. The solar cell panel 200 includes a plurality of solar cells 210 and a lower substrate 220 supporting the solar cells 200.

For example, the solar cells 210 may include a CIGS-based solar cell, a silicon-based solar cell, a dye-sensitized solar cell, a group II-VI compound semiconductor solar cell, or a group III-V compound semiconductor solar cell.

In addition, the solar cells 6 may be disposed on a transparent substrate such as a glass substrate.

The solar cells 210 may be arranged in the shape of a stripe. In addition, the solar cells 210 may be arranged in various shapes such as a matrix shape.

The bus bar 500 is disposed on the solar cell panel 200.

For example, referring to FIG. 3, the bus bar 500 includes a first bus bar 510 and a second bus bar 520.

The first bus bar 510 makes contact with the solar cells 210. In detail, the first bus bar 510 makes contact with a top surface of one outermost solar cell and a top surface of an opposite outermost solar cell of the solar cells 210. The first bus bar 510 makes contact with top surfaces of two of the solar cells 210, and is electrically connected to the solar cells 210.

The second bus bar 520 extends from the first bus bar 510. Further, the second bus bar 520 directly makes contact with the lower substrate 220. The second bus bar 520 extends to an outer peripheral portion of the lower substrate 220. The second bus bar 520 may extend by passing through a groove located at the outer peripheral portion of the lower substrate 200. In addition, the second bus bar 520 may be connected to a connecting member located at a bottom surface of the lower substrate 220.

The bus bar 5 may include a conductor, and for example, the material constituting the bus bar 5 may include copper (Cu).

The lower substrate 200 may support the solar cells 210.

In detail, the lower substrate 220 may include a first lower substrate 221, a second lower substrate 222, and a third lower substrate 223.

The first lower substrate 221 may support the solar cells 210 and the bus bar 500. The first lower substrate 221 directly makes contact with the solar cells 210 and the bus bar 500.

The second lower substrate 222 extends from the first lower substrate 221 while being bent from the first lower substrate 221. The second lower substrate 222 is disposed along a lateral side of the buffer part 400. In detail, the second lower substrate 222 may be disposed along a lateral side of a first buffer part 410.

The third lower substrate 223 extends from the second lower substrate 222 while being bent from the second lower substrate 222. The third lower substrate 223 directly makes with the protective substrate 300. In detail, a top surface of the third lower substrate 223 directly makes with a bottom surface of the protective substrate 300.

The third lower substrate 223 may be disposed on the second bus bar 520. That is, if the third lower substrate 223 has a color, the third lower substrate 223 may shield the second bus bar 520. Accordingly, a separate work for shielding the bus bar 520 may be omitted. That is, a process may be simplified.

The first lower substrate 221, the second lower substrate 222, and the third lower substrate 223 are integrally formed with each other.

The lower substrate 220 may include a metal or a plastic material. That is, an outer peripheral portion of the lower substrate 220 may be folded inward of the solar cell module using a flexible property of the lower substrate 220.

Accordingly, the route of moisture penetration through the lower substrate 200 becomes long so that moisture penetration into the solar cell module may be minimized. Accordingly, the reliability of the solar cell module can be improved.

The protective substrate 300 is disposed over the solar cell panel 200. In detail, the protective substrate 300 is provided in opposition to the solar cell panel 200.

The protective substrate 300 may be transparent and have a high strength. The material constituting the protective substrate 300 may include tempered glass.

The first buffer part 400 includes a first buffer part 410 and a second buffer part 420.

The first buffer part 410 is interposed between the protective substrate 300 and the solar cell panel 200. The first buffer part 410 protects the solar cell panel 200 from the external physical shock. In addition, the first buffer part 410 prevents the protective substrate 300 from colliding with the solar cell panel 200.

The second buffer part 420 is disposed under the solar cell panel 200. A back sheet may be further disposed at a lower portion of the solar cell panel, and the second buffer part 420 may bond the back sheet to the solar cell panel 200.

The buffer part 400 may perform an anti-reflective function so that a greater quantity of light is incident onto the solar cell panel 200.

The material constituting the buffer part 400 may include ethylene vinyl acetate (EVA) resin.

The protective substrate 300 and the buffer sheet 400 are disposed inside the frame 100. In detail, the lateral sides of the solar cell panel 200, the protective substrate 300 and the buffer part 400 are inserted into and fixed to the frame 100.

Hereinafter, a solar cell module according to the second embodiment will be described with reference to FIG. 4. In the following description, the details of structures and components the same as those of the first embodiment or extremely similar to those of the first embodiment will be omitted except for only structures and components making the difference from those of the first embodiment for the purpose of clear and simple explanation.

FIG. 4 is a sectional view showing a solar cell module according to a second embodiment.

Referring to FIG. 4, the solar cell module 20 according to the second embodiment includes a lower substrate 220 supporting solar cells 210. The lower substrate 220 includes a first lower substrate 221, a second lower substrate 222, and a third lower substrate 223. The third lower substrate 223 extends from the second lower substrate 222 while being bent from the second lower substrate 222. The third lower substrate 223 is inserted into the buffer part 400. In detail, the third lower substrate 223 is inserted into the first buffer part 410. Accordingly, a top surface of the third lower substrate 223 directly makes contact with the first buffer part 410.

Hereinafter, a solar cell module according to the third embodiment will be described with reference to FIG. 5. Referring to FIG. 5, the solar cell module 30 according to the third embodiment includes a lower substrate 220 supporting solar cells 210. The lower substrate 220 includes a first lower substrate 221, a second lower substrate 222, and a third lower substrate 223. The third lower substrate 223 extends from the second lower substrate 222 while being bent from the second lower substrate 222. The third lower substrate 223 is disposed on a second bus bar 520 and the solar cell 210. That is, the third lower substrate 223 extends to a deep portion of the solar cell module so that a moisture penetration path may be lengthened.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A solar cell module comprising:
a solar cell panel;
a protective substrate on the solar cell panel;
a buffer part under the protective substrate; and
a frame receiving the solar cell panel, the protective substrate and the buffer part,
wherein the solar cell panel comprises:
a lower substrate;
a plurality of solar cells on the lower substrate; and
a bus bar connected to the plurality of solar cells,
wherein the buffer part is between the plurality of solar cells and the protective substrate,
wherein the lower substrate comprises a first lower substrate part supporting the plurality of solar cells, a second lower substrate part disposed along a lateral side of the buffer part, and a third lower substrate part extending from the second lower substrate part while being bent from the second lower substrate part,
wherein the first lower substrate part directly makes contact with the plurality of solar cells,
wherein the second lower substrate part extends from the first lower substrate part while being bent from the first lower substrate part,
wherein the first lower substrate part, the second lower substrate part, and the third lower substrate part are made by a single element,
wherein the third lower substrate part is disposed on the bus bar,
wherein the lower substrate comprises a plastic material,
wherein the third lower substrate part has a color,
wherein the first lower substrate part and the third lower substrate part are disposed facing each other,
wherein a portion of the bus bar is disposed between the first lower substrate part and the third lower substrate part, and
wherein a top surface of the third lower substrate part directly makes contact with the protective substrate.

2. The solar cell module of claim 1, wherein the third lower substrate part is inserted into the buffer part.

3. The solar cell module of claim 2, wherein a top surface of the third lower substrate part directly makes contact with the buffer part.

4. The solar cell module of claim 1,
wherein the bus bar comprises a first bus bar making contact with a top surface of the solar cells and a second bus bar making contact with a top surface of the first lower substrate part, and
the third lower substrate part is disposed on the second bus bar.

5. The solar cell module of claim 1, wherein the third lower substrate part is disposed on a part of the solar cells.

6. The solar cell module of claim 4, wherein the third lower substrate part is disposed on the second bus bar and the solar cells.

7. The solar cell module of claim 1, wherein the first lower substrate part and the second lower substrate part are integrally formed with each other.

8. The solar cell module of claim 1, wherein the solar cells include a CIGS-based solar cell, a silicon-based solar cell, a dye-sensitized solar cell, a group II-VI compound semiconductor solar cell, or a group III-V compound semiconductor solar cell.

* * * * *